United States Patent
Yokoyama et al.

(10) Patent No.: US 7,324,126 B2
(45) Date of Patent: Jan. 29, 2008

(54) THERMAL HEAD INCLUDING BONDING PADS HAVING IRREGULAR SURFACES FORMED BY FORMING IRREGULARITIES ON UNDERLAYER

(75) Inventors: Shinya Yokoyama, Niigata-ken (JP); Motoki Hirayama, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 201 days.

(21) Appl. No.: 11/339,370

(22) Filed: Jan. 25, 2006

(65) Prior Publication Data
US 2006/0176359 A1    Aug. 10, 2006

(30) Foreign Application Priority Data
Feb. 7, 2005    (JP)    ............................. 2005-030648

(51) Int. Cl.
*B41J 2/335* (2006.01)
(52) U.S. Cl. .................................................. 347/206
(58) Field of Classification Search ................ 347/200, 347/201, 204, 205, 206, 208, 209
See application file for complete search history.

(56) References Cited

U.S. PATENT DOCUMENTS 6,304,280 B1 * 10/2001 Yamade et al. ............. 347/203

FOREIGN PATENT DOCUMENTS

JP        A1 5-251856        9/1993

\* cited by examiner

*Primary Examiner*—K. Feggins
(74) *Attorney, Agent, or Firm*—Brinks Hofer Gilson & Lione

(57) ABSTRACT

A thermal head includes a large number of heating resistors disposed at a regular interval, individual conductors individually connected to each of the heating resistors, and common conductors connected to each of the heating resistors in common, the individual conductors and the common conductors serving as conductors for supplying the heating resistors with a current. In the thermal head, an underlayer having a large number of irregularities is provided and a conductor layer is provided on the underlayer along the irregularities. Thereby, bonding pads that are composed of the conductor layer and that have irregularities are provided as electrodes of the individual conductors or the common conductors.

4 Claims, 3 Drawing Sheets

THERMAL HEAD INCLUDING BONDING PADS HAVING IRREGULAR SURFACES FORMED BY FORMING IRREGULARITIES ON UNDERLAYER

BACKGROUND OF THE INVENTION

1. Field of the Invention

The present invention relates to a thermal head installed in a photo-printer, a thermal printer, or the like.

2. Description of the Related Art

A thermal head installed in a photo-printer, a thermal printer, or the like includes a heat-insulating layer composed of a material that highly insulates heat, such as glass; a plurality of heating resistors that generates heat by electrical conduction; common electrodes that are electrically connected to all the heating resistors in common; and a plurality of individual electrodes electrically connected to the heating resistors individually, all of which are provided on a substrate having an excellent heat dissipation effect. In such a thermal head, the heating resistors generate heat by way of electrical conduction via the common electrode and the individual electrodes, and the heating resistors are then brought into contact with an ink ribbon or a printing medium (heat-sensitive paper) with pressure to perform printing.

FIG. 7 shows a plan view of a known thermal head (a protective layer is not shown) having a folding structure. In the folding structure, an end of a heating resistor 105a and an end of a heating resistor 105b are connected with a U-shaped folding conductor 110 to form a print dot portion D. The other end of the heating resistor 105a is connected to an individual electrode 107, and the other end of the heating resistor 105b is connected to a common electrode 108. Each of the common electrodes 108 is connected to a common line 109 extending in the direction parallel to the arranging direction of the print dot portions D. Electricity is supplied from both ends disposed in the longitudinal direction of the common line 109. A bonding pad 111 for wire bonding is provided at the other end of each individual electrode 107, the end being opposite to the heating resistor 105a. In the known bonding pad 111, a heat-insulating layer 102 is provided on a substrate 101 and a metal thin film is provided on the heat-insulating layer 102.

A molten bonding ball is welded on the surface of the bonding pad 111. A wire 123 from the bonding ball is extended and is then welded on a bonding pad 121 of a drive unit 120. The surface of the known bonding pad 111 is flat.

In the wire bonding technology, in order to improve the bonding strength by welding between the bonding pad 111 and the bonding ball, a technology in which irregularities are formed on the surface of the bonding pad 111 has been developed (refer to Japanese Unexamined Patent Application Publication No. 5-251856). FIG. 8 shows a cross-sectional view of such a bonding pad 111.

According to the known art, the bonding pad 111 is formed on the substrate 101 having a flat surface so as to have a uniform thickness, and the surface of the bonding pad 111 is then formed by cutting with a diamond-cutter or the like. However, in this known cutting method, the bonding pad 111 and the like are formed on the substrate 101 by vacuum deposition or the like and a mechanical cutting must be then performed, resulting in an increase in the number of steps of production. In addition, a mechanical external force is applied on the bonding pad 111 during cutting, the following problems may occur: The bonding pad 111 may be peeled off, it is difficult to decrease the thickness of the bonding pad 111 because the bottom part of the bonding pad 111 after cutting has a small thickness, the periphery of the bonding pad 111 may be damaged, and the like.

SUMMARY OF THE INVENTION

The present invention has been made in view of the above problems, and it is an object of the present invention to provide a thermal head that can be easily produced and that can provide high adhesiveness of wire bonding even when a bonding pad has a small thickness.

In order to solve the above problems, a thermal head of the present invention includes a large number of heating resistors disposed at a regular interval; individual conductors individually connected to each of the heating resistors; and common conductors connected to each of the heating resistors in common; the individual conductors and the common conductors serving as conductors for supplying the heating resistors with a current, wherein bonding pads serving as electrodes of the individual conductors or the common conductors include an underlayer having a large number of irregularities, and are composed of a conductor layer that is provided on the underlayer and that has irregularities corresponding to the irregularities of the underlayer.

A thermal head of the present invention includes a large number of heating resistors disposed at a regular interval; individual conductors individually connected to each of the heating resistors; and common conductors connected to each of the heating resistors in common; the individual conductors and the common conductors serving as conductors for supplying the heating resistors with a current, wherein an underlayer having a large number of irregularities is disposed at bonding pad-forming areas provided on the individual conductors or the common conductors, the underlayer being formed before a heating resistor layer serving as the heating resistors is formed, and bonding pads composed of a conductor layer having irregularities corresponding to the shape of the underlayer are disposed at the bonding pad-forming areas on the underlayer.

A thermal head of the present invention includes a large number of heating resistors disposed at a regular interval; individual conductors individually connected to each of the heating resistors; and common conductors connected to each of the heating resistors in common; the individual conductors and the common conductors serving as conductors for supplying the heating resistors with a current, wherein an underlayer that is composed of a heating resistor layer and that has a large number of irregularities is disposed at bonding pad-forming areas provided on the individual conductors or the common conductors, the underlayer being formed in a step of forming the heating resistor layer serving as the heating resistors, and bonding pads having irregularities corresponding to the irregularities of the underlayer are disposed, the bonding pads being composed of a conductor layer provided on the underlayer.

A thermal head of the present invention includes a large number of heating resistors disposed at a regular interval; an insulating barrier layer covering the surface of each of the heating resistors; individual conductors individually connected to each of the heating resistors; and common conductors connected to each of the heating resistors in common; the individual conductors and the common conductors serving as conductors for supplying the heating resistors with a current, wherein a pad area-insulating barrier layer that is composed of the insulating barrier layer and that has a large number of irregularities is disposed as an underlayer at bonding pad-forming areas provided on the individual conductors or the common conductors, the pad area-insulating barrier layer being formed in a step of forming the insulating barrier layer on a heating resistor layer serving as the heating resistors, and bonding pads having irregularities corresponding to the irregularities of the underlayer are disposed, the bonding pads being composed of a conductor layer provided on the underlayer.

According to the thermal head of the present invention, the surface of a bonding pad has irregularities corresponding to irregularities of an underlayer. Consequently, the thickness of the bonding pad substantially becomes uniform regardless of a protruded portion or a recess portion, and thus the thickness of the recess portion can also be sufficiently provided.

According to the thermal head of the present invention, irregularities can be formed on the boding pads in a series of steps of producing the thermal head. Thus, the number of production steps is small and the time required for the production is also short. Furthermore, since no mechanical external force is applied, damage such as the peeling of the bonding pads during production is not caused.

DESCRIPTION OF THE PREFERRED EMBODIMENTS

Figure 1:
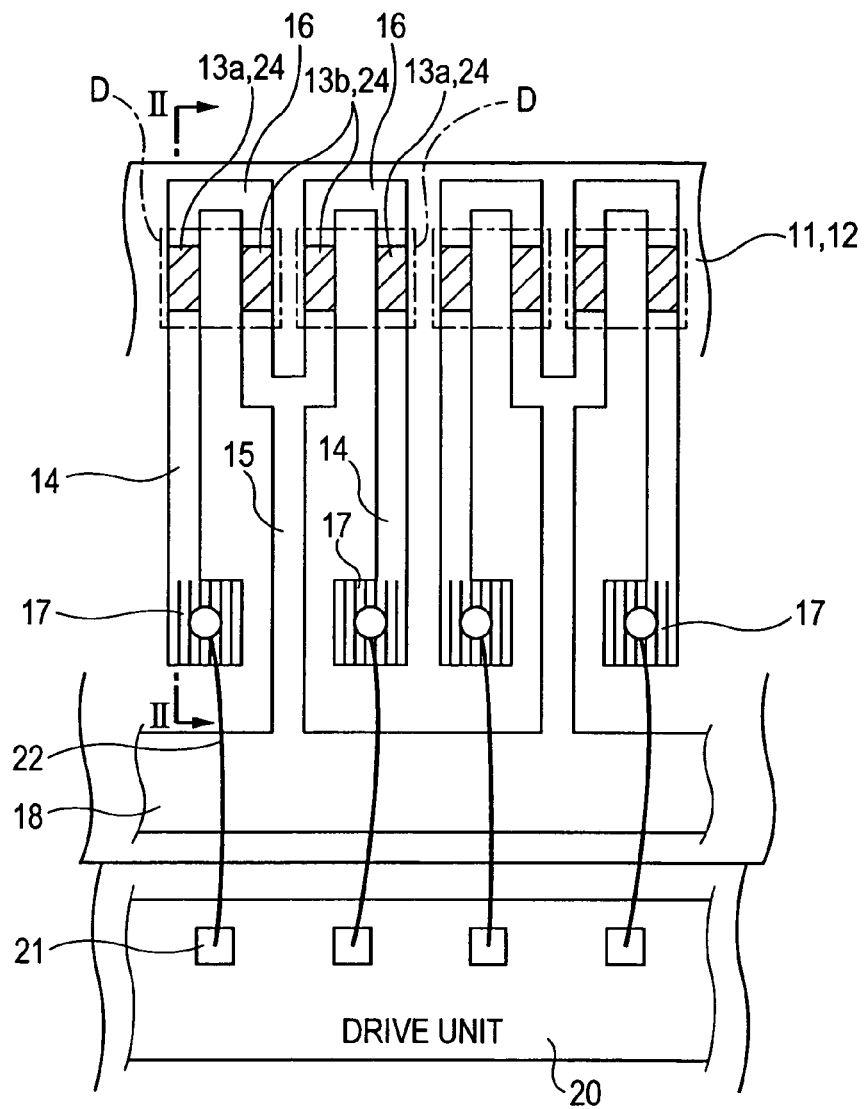
FIG. 1 is a plan view of an embodiment of a thermal head having a folding structure according to the present invention in which a protective layer is not shown.
Figure 2:
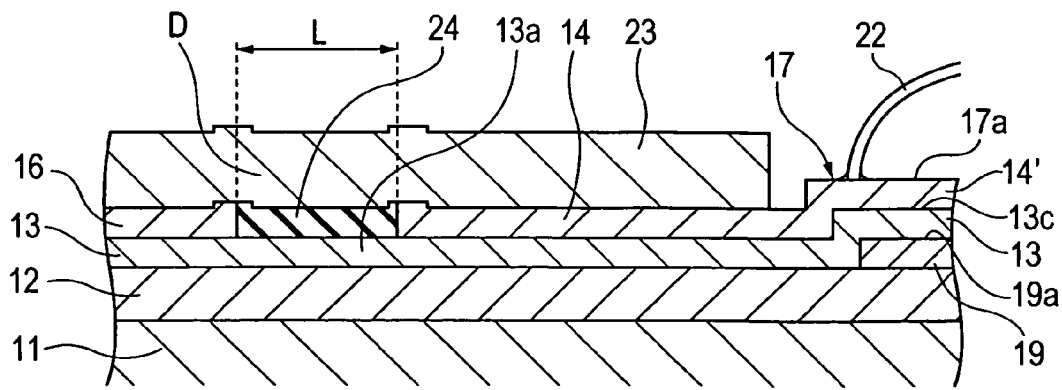
FIG. 2 is a cross-sectional view taken along cutting line II-II in FIG. 1 and FIG. 3.
Figure 3:
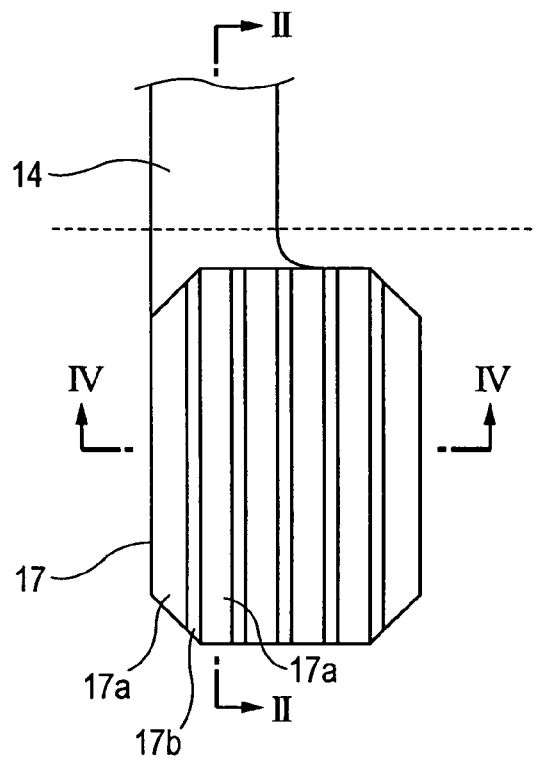
FIG. 3 is an enlarged plan view of a bonding pad portion of the thermal head.
Figure 4:
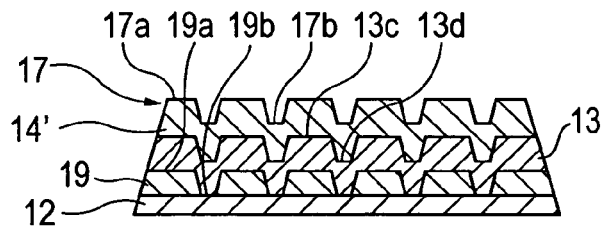
FIG. 4 is a cross-sectional view taken along cutting line IV-IV in FIG. 3.

Embodiments of the present invention will now be described with reference to the drawings. FIG. 1 is a plan view of an embodiment of a thermal head having a folding structure according to the present invention in which a protective layer is not shown, FIG. 2 is a cross-sectional view taken along cutting line II-II in FIG. 1, FIG. 3 is an enlarged plan view of a bonding pad portion of the thermal head, and FIG. 4 is a cross-sectional view taken along cutting line IV-IV in FIG. 3. The thermal head includes a plurality of print dot portions D disposed in a line at a predetermined interval in the horizontal direction in FIG. 1. In this thermal head, heat generated on each of the print dot portions D is provided to heat-sensitive paper or an ink ribbon, thereby performing a printing operation.

The thermal head includes a substrate 11 and a heat-insulating layer 12 formed on the substrate 11 so as to have a uniform thickness. Furthermore, heating resistors 13a and 13b, individual conductors 14, common conductors 15, connect conductors 16 connecting each pair of the heating resistors 13a and 13b, are provided on the heat-insulating layer 12. A bonding pad 17 is provided at an end of each of the individual conductors 14. A single print dot portion D is composed of two heating resistors 13a and 13b connected by the connect conductor 16. The common conductors 15 are electrically connected to each other via a common line 18 extending in the direction parallel to the arranging direction of each of the heating resistors 13a and 13b, and electric power is supplied from the common line 18. Each of bonding pads 17 is connected to a corresponding bonding pad 21 of a drive unit 20 with a wire 22 formed by wire bonding.

The drive unit 20 includes a plurality of bonding pads 21. The drive unit 20 also includes a plurality of switching elements (drive ICs) that switch conducting/non-conducting to the corresponding individual conductor 14 via the bonding pad 17 connected to the corresponding bonding pad 21 with the wire 22, and a plurality of external connection terminals. FIG. 1 briefly shows the structure of the thermal head. In reality, the wires 22 connecting each bonding pad 17 of the individual conductor 14 to the corresponding bonding pad 21 of the drive unit 20 are provided at a minute interval of about 50 μm.

An alumina-ceramic substrate, an alumina substrate, a silicon substrate, or the like, which has excellent heat dissipation effect is used as the substrate 11. The heat-insulating layer 12 is composed of, for example, glass-glaze that highly insulates heat.

The heating resistors 13a and 13b are composed of a cermet of a refractory metal, for example, Ta—Si—O, Ti—Si—O, or Cr—Si—O, which easily has a high resistance. The heating resistors 13a and 13b have a thickness of, for example, about 100 nm. Each of the heating resistors 13a and 13b is a part of a heating resistor layer 13, which is composed of a cermet such as Ta—$SiO_2$ and which is formed on the entire surface of the heat-insulating layer 12. The surfaces of the heating resistors 13a and 13b are covered with an insulating barrier layer 24. The planar size (length L and width) of each of the heating resistors 13a and 13b, i.e., the resistance of each of the heating resistors 13a and 13b, is specified by the insulating barrier layer 24. The insulating barrier layer 24 is composed of an insulating material such as $SiO_2$, SiON, or SiAlON.

The common conductor 15 is provided every two adjacent print dot portions D, and is disposed between corresponding individual conductors 14 extending from the two print dot portions D. The common conductors 15 substantially has a Y-shape including a U-shaped portion connected to two adjacent heating resistors 13b and a linear portion extending from the U-shaped portion in the direction parallel to the longitudinal direction of the heating resistors 13b. Each of the common conductors 15 is connected to the common line 18 at an end opposite to the side of the heating resistors 13b. The common line 18 extends in the arranging direction of the plurality of print dot portions D and is connected to the plurality of common conductors 15 in common. Power supplies (not shown in the figure) are connected to the common line 18. The electric power supplied from the power supplies to the common line 18 is supplied to all the print dot portions D through the common conductors 15.

The individual conductor 14 is provided every print dot portion D, and extends in the direction of the electrical conduction (the vertical direction in FIG. 1) of the heating resistor 13a. The bonding pad 17 for wire bonding is provided at an end of the individual conductor 14 opposite to the side of the heating resistor 13a.

The individual conductors 14, the common conductors 15, and the connect conductors 16 are formed from a part of a conductor layer 14', and are composed of a metal selected from Au, Ag, Cu, and Al, or an alloy thereof. The individual conductors 14, the common conductors 15, and the connect conductors 16 of this embodiment have a thickness of, for example, about 300 to 500 nm. Furthermore, the individual conductors 14 except for the bonding pads 17, the common conductors 15, the connect conductors 16, and the insulating barrier layers 24 are covered with an abrasion-resistant protective layer 23.

An underlayer 19 having a large number of irregularities (hillocks or projections), grooves, or holes thereon is provided at bonding pad-forming areas on the heat-insulating layer 12. The underlayer 19 in this embodiment shown in the figures has a vertical striped irregular pattern in which protruded portions 19a and recess portions 19b are arranged at a predetermined interval. The protruded portions 19a and the recess portions 19b each have a predetermined width and extend linearly. The surfaces of the heat-insulating layer 12 disposed between the protruded portions 19a are exposed on the recess portions 19b. Alternatively, the recess portions 19b may be formed so that the heat-insulating layer 12 is not exposed.

The heating resistor layer 13 having protruded portions 13c and recess portions 13d is formed along the protruded portions 19a and the recess portions 19b of the underlayer 19. Furthermore, the conductor layer 14' having protruded portions 17a and recess portions 17b that correspond to the protruded portions 13c and the recess portions 13d of the heating resistor layer 13 is formed on the heating resistor layer 13. This conductor layer 14' forms the bonding pad 17. In the cross-section of the bonding pad 17, the protruded portions 17a and the recess portions 17b substantially have a uniform thickness. Thus, in the bonding pad 17, the protruded portions 17a and the recess portions 17b, which substantially have a uniform thickness, are formed along the irregularities of the underlayer 19. Consequently, the bonding pad 17 is not easily peeled off and characteristics thereof, such as the resistance, are also stabilized.

An irregular pattern, a recess pattern, or a protrusion pattern of the underlayer 19 may be arbitrarily arranged on the surface. A plurality of grooves or holes may be formed in other embodiments. In the embodiment shown in the figures, the longitudinal direction of the protruded portions 19a and the recess portions 19b is parallel to the direction in which the wire 22 is extended during wire bonding. This shape provides a satisfactory extending property of the wire 22 and satisfactory adhesiveness and weldability with the bonding pad 17. In the embodiment shown in the figures, the material of the underlayer 19 remains only under the protruded portions 17a. Alternatively, the underlayer 19 may be formed so that the material of the underlayer 19 remains not only under the protruded portions 17a but also under the recess portions 17b.

Methods for producing a thermal head of the present invention will be described, but a method for producing a thermal head, which is a precondition, will now be briefly described first. A substrate 11 having a heat-insulating layer 12 thereon is prepared. Subsequently, a heating resistor layer 13 is formed on the entire surface of the heat-insulating layer 12. An insulating barrier layer 24 is formed on a part of the heating resistor layer 13, the part specifying the planar dimensions of heating resistors 13a and 13b. A conductor layer 14' is then entirely formed on the heating resistor layer 13 and the insulating barrier layer 24. Subsequently, the heating resistor layer 13 and the conductor layer 14' are patterned so as to have rough shapes of individual conductors 14, common conductors 15, connect conductors 16, and a common line 18. The conductor layer 14' on the insulating barrier layer 24 is then removed to expose the surface of the insulating barrier layer 24. Thus, the heating resistors 13a and 13b are formed. The insulating barrier layer 24 is not essential. However, when the insulating barrier layer 24 is provided, the heating value of a large number of the heating resistors can be precisely determined to improve the quality of printed images.

By the above steps, the areas covered with the insulating barrier layer 24 form the heating resistors 13a and 13b. The conductor layer 14' is separated into the U-shaped folding connect conductors 16, the individual conductors 14, and the common conductors 15. Each of the connect conductors 16 electrically connects an end of the heating resistor 13a to an end of the adjacent heating resistor 13b. Each of the individual conductors 14 and each of the common conductors 15 are connected to the other ends of the pair of the heating resistors 13a and 13b, respectively, in the same direction. The common conductors 15 and the common line 18 are integrally formed.

Methods for producing a bonding pad 17 of the thermal head will be described.

(1) The Case Where an Irregular Pattern is Formed on an Underlayer

A method for producing a bonding pad 17 of the thermal head will now be described with reference to FIG. 4. Before a heating resistor layer 13 is formed, an underlayer 19 is formed on a heat-insulating layer 12 at bonding pad-forming areas, which form an end of individual conductors 14. The underlayer 19 is composed of the same insulating material, for example, $SiO_2$, SiON, or SiAlON, as that of the insulating barrier layer 24, and is formed by a predetermined method.

Subsequently, a resist is formed on the underlayer 19 so that areas that form recess portions are not covered and only areas that form protruded portions are covered with the resist. For example, a plurality of resist lines having a predetermined width is formed at a regular interval in the direction parallel to the stretching direction of a wire. The underlayer 19 disposed in areas that are not covered with the resist is removed by reactive ion etching (RIE) or the like to expose the heat-insulating layer 12. The resist is then removed. Thus, irregularities 19b and 19a including protruded portions 19a composed of the insulating material and recess portions 19b on which the heat-insulating layer 12 is exposed, the recess portions 19b being disposed between the protruded portions 19a, are formed on the underlayer 19.

Subsequently, the heating resistor layer 13 is entirely formed on the heat-insulating layer 12 including the above underlayer 19. Consequently, as shown in FIG. 4, at the bonding pad-forming areas, the heating resistor layer 13 is formed on the irregularities 19b and 19a of the underlayer 19. Therefore, irregularities 13d and 13c corresponding to the irregularities 19b and 19a are transferred on the heating resistor layer 13.

Subsequently, a conductor layer 14' is formed and patterned to form individual conductors 14, common conductors 15, connect conductors 16, a common line 18, and bonding pads 17.

Thus, the bonding pad 17 composed of the conductor layer 14' is formed at an end of each individual conductor 14. The bonding pad 17 has irregularities 17b and 17a corresponding to the irregularities 19b and 19a of the underlayer 19. In this method, the conductor layer 14' may be formed at the bonding pad-forming areas without forming the heating resistor layer 13.

Figure 5:
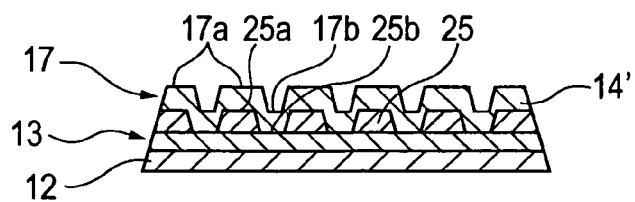
FIG. 5 is a cross-sectional view that is similar to FIG. 4 and that shows another embodiment of the present invention.

(2) The Case Where an Underlayer Having an Irregular Pattern is Formed on a Heating Resistor Layer A method for producing a bonding pad 17 of the thermal head will now be described with reference to FIG. 5. First, a heating resistor layer 13 is formed on the entire surface of a heat-insulating layer 12.

Subsequently, an insulating barrier layer 24 that specifies the planar dimensions of heating resistors 13a and 13b is formed on the heating resistor layer 13. At the same time, a pad area-insulating barrier layer 25 for forming an irregular pattern is also formed on the heating resistor layer 13 of bonding pad-forming areas, which form an end of individual conductors 14.

Subsequently, a resist is formed on the pad area-insulating barrier layer 25 so that areas that form recess portions are not covered and only areas that form protruded portions are covered with the resist. For example, a plurality of resist lines having a predetermined width is formed at a regular interval in the direction parallel to the stretching direction of a wire. Subsequently, the pad area-insulating barrier layer 25 disposed in areas that are not covered with the resist is removed by etching or the like, and the resist is then removed. Thus, the pad area-insulating barrier layer 25 disposed in areas covered with the resist remains on the heating resistor layer 13 of the bonding pad-forming areas. Consequently, an irregular pattern including protruded portions 25a composed of the pad area-insulating barrier layer 25 and recess portions 25b that are disposed between the protruded portions 25a and that have the bottom composed of the surface of the heating resistor layer 13 is formed.

A conductor layer 14' is then entirely formed on the surfaces of the heating resistor layer 13, the insulating barrier layer 24, and the pad area-insulating barrier layer 25. As shown in FIG. 5, at the bonding pad-forming areas, the conductor layer 14' is formed on the irregularities 25b and 25a due to the pad area-insulating barrier layer 25. Consequently, irregularities 17b and 17a corresponding to the irregularities 25b and 25a are transferred on the surface of the conductor layer 14'.

Subsequently, the conductor layer 14' is patterned to form individual conductors 14, common conductors 15, connect conductors 16, a common line 18, and bonding pads 17.

Thus, an underlayer having the irregularities 25b and 25a due to the pad area-insulating barrier layer 25 is formed at an end of each individual conductor 14. Consequently, the bonding pad 17 composed of the conductor layer 14', which has the irregularities 17a and 17b corresponding to the irregularities 25b and 25a, can be formed.

Figure 6:
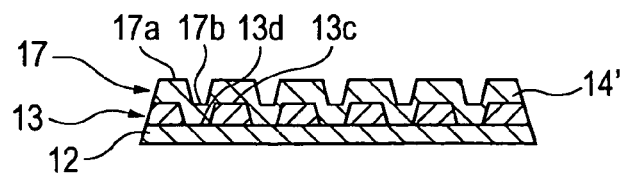
FIG. 6 is a cross-sectional view that is similar to FIG. 4 and that shows another embodiment of the present invention.
Figure 7:
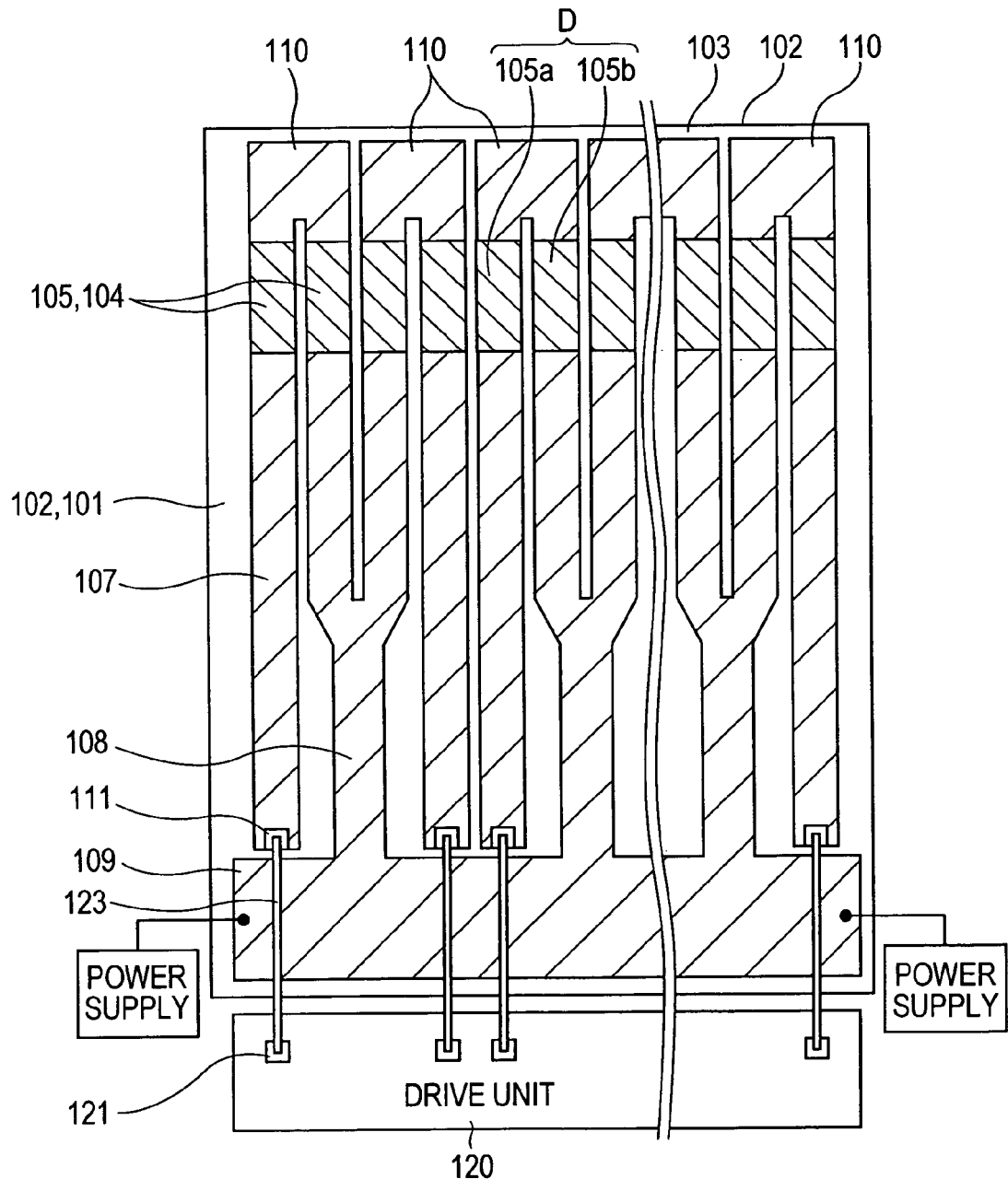
FIG. 7 is a plan view of a known thermal head having a folding structure in which a protective layer is not shown.
Figure 8:
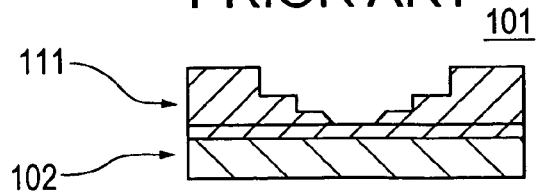
FIG. 8 is a cross-sectional view of a bonding pad in the known thermal head.

(3) The Case Where an Underlayer Having an Irregular Pattern is Formed Using a Heating Resistor Layer A method for producing a bonding pad 17 of the thermal head will now be described with reference to FIG. 6. First, a heating resistor layer 13 is formed on the entire surface of a heat-insulating layer 12.

Subsequently, a resist for forming an irregular pattern is formed on the heating resistor layer 13 of bonding pad-forming areas, which form an end of individual conductors 14. The resist is formed so that areas that form recess portions are not covered and only areas that form protruded portions are covered with the resist. For example, a plurality of resist lines having a predetermined width is formed at a regular interval in the direction parallel to the stretching direction of a wire.

Subsequently, the heating resistor layer 13 disposed in areas that are not covered with the resist is removed by etching or the like, and the resist is then removed. Thus, the heating resistor layer 13 disposed in areas covered with the resist remains at the bonding pad-forming areas on the heat-insulating layer 12. Consequently, irregularities 13d and 13c including protruded portions 13c composed of the heating resistor layer 13 and recess portions 13d that are disposed between the protruded portions 13c and that have the bottom composed of the surface of the heat-insulating layer 12 is formed.

Subsequently, an insulating barrier layer 24 that specifies the planar dimensions of heating resistors 13a and 13b is formed on the heating resistor layer 13. This insulating barrier layer 24 is not essential.

Subsequently, a conductor layer 14' is entirely formed on the surfaces of the heat-insulating layer 12, the heating resistor layer 13, and the insulating barrier layer 24. As shown in FIG. 6, at the bonding pad-forming areas, the conductor layer 14' is formed on the protruded portions 13c composed of the heating resistor layer 13 and the recess portions 13d. Consequently, irregularities 17b and 17a corresponding to the irregularities 13d and 13c are transferred on the surface of the conductor layer 14'.

Subsequently, the conductor layer 14' is patterned to form individual conductors 14, common conductors 15, connect conductors 16, a common line 18, and bonding pads 17.

Thus, an underlayer composed of irregularities 13d and 13d due to the heating resistor layer 13 is formed at an end of each individual conductor 14. Consequently, the bonding pad 17 composed of the conductor layer 14', which has the irregularities 17a and 17b corresponding to the irregularities 13d and 13c, can be formed.

As described above, according to these embodiments, an underlayer 19 having an irregular pattern thereon can be formed and a bonding pad 17 composed of a conductor layer, which has irregularities corresponding to the irregular pattern of the underlayer 19, can be formed in a series of steps of producing a thermal head. Therefore, the thermal head of the present invention can be produced without using different production equipment or a production line.

In the embodiments shown in the figures, the present invention is applied to a bonding pad for the individual conductor 14 of the thermal head. However, the present invention may be applied to other bonding pads for wire bonding, for example, a bonding pad for the common conductor 15 or a bonding pad for the drive unit 20.

What is claimed is:

1. A thermal head comprising:
   a large number of heating resistors disposed at a regular interval;
   individual conductors individually connected to each of the heating resistors; and
   common conductors connected to each of the heating resistors in common; the individual conductors and the common conductors serving as conductors for supplying the heating resistors with a current,
   wherein bonding pads serving as electrodes of the individual conductors or the common conductors include an underlayer having a large number of irregularities, and are composed of a conductor layer that is provided on the underlayer and that has irregularities corresponding to the irregularities of the underlayer.

2. A thermal head comprising:
   a large number of heating resistors disposed at a regular interval;
   individual conductors individually connected to each of the heating resistors; and common conductors connected to each of the heating resistors in common; the individual conductors and the common conductors serving as conductors for supplying the heating resistors with a current, wherein an underlayer having a large number of irregularities is disposed at bonding pad-forming areas provided on the individual conductors or the common conductors, the underlayer being formed before a heating resistor layer serving as the heating resistors is formed, and bonding pads composed of a conductor layer having irregularities corresponding to the shape of the underlayer are disposed at the bonding pad-forming areas on the underlayer.

3. A thermal head comprising:

a large number of heating resistors disposed at a regular interval;

individual conductors individually connected to each of the heating resistors; and common conductors connected to each of the heating resistors in common; the individual conductors and the common conductors serving as conductors for supplying the heating resistors with a current, wherein an underlayer that is composed of a heating resistor layer and that has a large number of irregularities is disposed at bonding pad-forming areas provided on the individual conductors or the common conductors, the underlayer being formed in a step of forming the heating resistor layer serving as the heating resistors, and bonding pads having irregularities corresponding to the irregularities of the underlayer are disposed, the bonding pads being composed of a conductor layer provided on the underlayer.

4. A thermal head comprising:

a large number of heating resistors disposed at a regular interval;

an insulating barrier layer covering the surface of each of the heating resistors;

individual conductors individually connected to each of the heating resistors; and common conductors connected to each of the heating resistors in common; the individual conductors and the common conductors serving as conductors for supplying the heating resistors with a current, wherein a pad area-insulating barrier layer that is composed of the insulating barrier layer and that has a large number of irregularities is disposed as an underlayer at bonding pad-forming areas provided on the individual conductors or the common conductors, the pad area-insulating barrier layer being formed in a step of forming the insulating barrier layer on a heating resistor layer serving as the heating resistors, and bonding pads having irregularities corresponding to the irregularities of the underlayer are disposed, the bonding pads being composed of a conductor layer provided on the underlayer.

* * * * *